(12) United States Patent
Neftin et al.

(10) Patent No.: US 6,448,510 B1
(45) Date of Patent: Sep. 10, 2002

(54) SUBSTRATE FOR ELECTRONIC PACKAGING, PIN JIG FIXTURE

(75) Inventors: Shimon Neftin, Kiryat Shmona; Uri Mirsky, Nofit, both of (IL)

(73) Assignee: Micro Components Ltd., Migdal Haemek (IL)

( * ) Notice: Subject to any disclaimer, the term of this patent is extended or adjusted under 35 U.S.C. 154(b) by 0 days.

(21) Appl. No.: 09/424,179

(22) PCT Filed: May 20, 1999

(86) PCT No.: PCT/IL98/00230

§ 371 (c)(1),
(2), (4) Date: Jun. 22, 2000

(87) PCT Pub. No.: WO98/53499

PCT Pub. Date: Nov. 26, 1998

(30) Foreign Application Priority Data

May 20, 1997 (IL) .................................................. 120866

(51) Int. Cl.[7] ............................ H05K 1/11; H01R 12/04
(52) U.S. Cl. ...................... 174/264; 174/256; 174/258; 174/262; 361/809; 29/846; 428/901
(58) Field of Search ................................ 174/263, 255, 174/256, 257, 258, 261, 262, 264, 265, 260, 52.4, 252, 266; 29/830, 846, 840, 852, 842, 843; 361/760, 803, 808, 809, 810, 717, 712, 713, 719, 720, 704, 707; 428/901, 209; 257/697, 699, 771, 770, 778, 765, 764, 700, 702, 737, 238

(56) References Cited

U.S. PATENT DOCUMENTS

| | | |
|---|---|---|
| 2,305,990 A | 12/1942 | Prest |
| 3,622,473 A | 11/1971 | Ohta et al. |
| 4,045,302 A * | 8/1977 | Gibbs et al. ................. 295/124 |
| 4,285,781 A | 8/1981 | Le Rouzic et al. |
| 4,445,981 A | 5/1984 | Ishii et al. |
| 5,022,976 A | 6/1991 | Roll et al. |
| 5,045,921 A | 9/1991 | Lin et al. |
| 5,112,668 A * | 5/1992 | Rabiet et al. ................ 428/137 |

(List continued on next page.)

FOREIGN PATENT DOCUMENTS

| | | |
|---|---|---|
| EP | 0335291 A2 | 10/1989 |
| EP | 0563744 A2 | 10/1993 |
| FR | 2459557 | 1/1981 |
| FR | 2466103 | 4/1981 |
| GB | 2080630 * | 8/1980 |
| GB | 2162694 * | 8/1984 |
| GB | 2206451 * | 1/1989 |
| JP | 54032279 | 3/1979 |
| JP | 57126995 | 8/1982 |
| JP | 59094438 | 5/1984 |
| JP | 01180998 | 7/1989 |
| JP | 3075604 | 3/1991 |
| WO | WO 94/22168 | 9/1994 |
| WO | WO95/08841 | 3/1995 |
| WO | WO96/03771 | 2/1996 |
| WO | WO 98/53499 | 11/1998 |

OTHER PUBLICATIONS

IBM Technical Disclosure Bulletin, NN8006374, vol. 23, pp. 374–377, Jun. 1980, U.S.

*Primary Examiner*—Kamand Cunio
*Assistant Examiner*—I B Patel
(74) *Attorney, Agent, or Firm*—Fish & Richardson P.C.

(57) ABSTRACT

A substrate for electronic packaging, the substrate having a discrete, generally prismatoid, initially electrically conductive valve metal solid body with one or more spaced apart, original valve metal vias each individually electrically islolated by a porous oxidized body portion therearound. A pin jig fixture for mechanically masking a metal surface, the pin jig fixture having an anodization resistant bed of pins each pin having a leading end surface for intimate juxtaposition against a metal surface to mask portions thereof.

19 Claims, 5 Drawing Sheets

U.S. PATENT DOCUMENTS

| | | | |
|---|---|---|---|
| 5,229,549 A | * 7/1993 | Yamakawa et al. | 174/262 |
| 5,262,226 A | 11/1993 | Yoshida | |
| 5,355,283 A | 10/1994 | Marrs et al. | |
| 5,580,825 A | * 12/1996 | Labunov et al. | 438/635 |
| 5,629,835 A | 5/1997 | Mahulikar et al. | |
| 5,661,341 A | 8/1997 | Neftin | |
| 5,767,575 A | 6/1998 | Lan et al. | |
| 5,774,336 A | * 6/1998 | Larson | 361/720 |
| 5,946,600 A | * 8/1999 | Hurwitz et al. | 438/688 |
| 5,952,083 A | * 9/1999 | Parthasarathi et al. | 428/209 |
| 6,046,499 A | * 4/2000 | Yano et al. | 257/712 |
| 6,235,181 B1 | * 5/2001 | Kinard et al. | 205/148 |
| 6,236,112 B1 | * 5/2001 | Horiuchi et al. | 257/734 |
| 6,262,477 B1 | * 7/2001 | Mahulikar et al. | 257/698 |

* cited by examiner

SUBSTRATE FOR ELECTRONIC PACKAGING, PIN JIG FIXTURE

FIELD OF THE INVENTION

This invention relates to substrates for electronic packaging including inter alia ball grid array packaging (BGA), chip size/scale package (CSP) and multi-chip/module packaging (MCP/CM), and a process of manufacturing therefor. In addition, the invention relates to a fire for masking purposes, and a process using the fixture for preparing a selectively patterned valve metal surface.

BACKGROUND OF THE INVENTION

Conventional electronic packaging includes a discrete substrate on which one or more integrated circuit chips (ICCs) are mounted on its topside, for example. in the case of BGA, as illustrated and described in U.S. Pat. No. 5,355,283 to Marrs et al. The discrete substrate can be of a wide range of materials including inter alia aluminum and irrespective of its material, through holes are drilled between its topside and underside. In the case of an aluminum substrate, each hole is initially anodized to create an insulating sleeve prior to the insertion of a metal pin, thereby enabling electrical and thermal communication between its topside and underside.

Depending on the intended complexity of an electronic package, a multi-layer interconnect structure can be interdisposed between the ICCs and the substrate, for example, as illustrated and described in U.S. Pat. No. 5,661,341 to Neftin. Such a multi-layer interconnect structure has one or more aluminum layers, each layer being deposited on a previously prepared topside and typically having a thickness in the order of between about 0.5 $\mu$m and about 20 $\mu$m.

Conventional masking for area selective anodization purposes is a relatively complicated and expensive process including the application and subsequent removal of an inert masking layer using photolithography and deposition techniques, the layer being in the form of a photo material, a dense oxide layer, a tantalum metal thin film, and the like.

SUMMARY OF THE INVENTION

In accordance with a first aspect of the present invention, there is provided a substrate for electronic packaging, the substrate comprising a discrete, generally prismatoid, initially electrically conductive valve metal solid body with a pair of opposing major surfaces, said body having one or more original valve metal filled vias substantially perpendicular to said major surfaces, said filled vias being spaced apart and individually electrically isolated by a porous oxidized body portion therearound.

A substrate in accordance with the present invention can be fabricated from suitable valve metal blanks of aluminum, titanium, or tantalum, and preferably inter alia Al5052, Al5083, Al1100, Al1145, and the like. Such a substrate can be readily manufactured to customer requirements in terms of a desired filled via pattern; electrical properties; the relative proportions of the original valve metal filled vias and the porous oxidized body portions; thermo-mechanical properties such as thermal coefficient of expansion (TCE), substrate strength. Young modulus, elasticity; thermal properties such as thermal conductivity coefficient, and other factors. Such a substrate can be manufactured with a minimum filled via diameter of about 25 $\mu$mm and a minimum center to center distance between adjacent filled vias of about 50 $\mu$m, thereby affording high miniturization and high fluency operation of electronic packaging.

In accordance with a second aspect of the present invention, there is provided a process for manufacturing a discrete substrate fur electronic packaging, the process comprising the steps of:

(a) providing a discrete, generally prismatoid, initially electrically conductive valve metal, solid blank having a pair of opposing major surfaces, the blank having a plurality of spaced apart generally cylindrical through sections, each through section having end surfaces and extending substantially perpendicular to the pair of opposing major surfaces;

(b) selectively masking both end surfaces of one or more of the through sections; and (c) porously oxidizing the blank whereupon a porous oxidized portion forms around a through section whose both end surfaces are masked thereby retaining the through section as an original metal valve filled via.

A process of manufacturing a discrete substrate for electronic packaging in accordance with the present invention involves a low number of steps and is suitable for Be area panel production. During or post anodization suitable can be impregnated into the blank's oxidized portions which typically thicken and therefore require planarization to restore them to their original thickness.

The porous anodization can be either one- or two-sided depending on the thickness of the generally cylindrical through sections some of which are to be retained as original valve metal filled vias. Typically, one-sided porous anodization can be applied to a maximum through section thickness of about 150 $\mu$m whilst two-sided porous anodization can be applied to a maximum through section thickness of about 300 $\mu$m. One- and two-sided porous anodization can be effected in a conventional manner, for example, as illustrated and described in U.S. Pat. No. 5,661,341 to Neftin.

In accordance with a third aspect of the present invention, there is provided a pin jig fixture for mechanically masking a valve metal surface, the pin jig comprising an anodization resistant bed of pins each having a leading end surface for intimate juxtaposition against a portion of the metal surface whereby said portion is masked.

A pin jig fixture in accordance with the present invention enables the simultaneous masking of one or more portions of a valve metal surface by its mechanical clamping thereagainst. Typically, the pins have planar end surfaces which are co-planar, however, a jig pin fixture can have pins of different lengths whereby their end surfaces lie on different parallel planes. The bed of pins can be fabricated from any suitable anodization resistant material including ceramics, valve metals, and the like.

The pin jig fixture can be preferably employed to directly oxidize those non-masked portions immediately surrounding the metal surface portions masked thereby, in which case, the pins are fabricated from valve metal and have electrically conductive end surfaces connectable to a power source. In addition, the pin jig fixture advantageously negates the need for an otherwise redundant portion of a substrate, such portion conventionally being initially used for connection to an electrical source and which is subsequently removed.

In accordance with a fourth aspect of the present invention, there is provided a process for preparing a selectively patterned valve metal surface, the process comprising the steps of:

(a) providing a pin jig fixture having an anodization resistant bed of pins each having a leading end surface;

(b) intimately juxtaposing leading end surfaces against a valve metal surface to mask portions thereof; and (c) anodizing the masked metal surface.

BRIEF DESCRIPTION OF THE DRAWINGS

In order to understand the invention and to see how it may be carried out in practice, preferred embodiments will now be described, by way of non-limiting examples only, with reference to the accompanying drawings, in which.

DETAILED DESCRIPTION OF THE DRAWINGS

Figure 1:
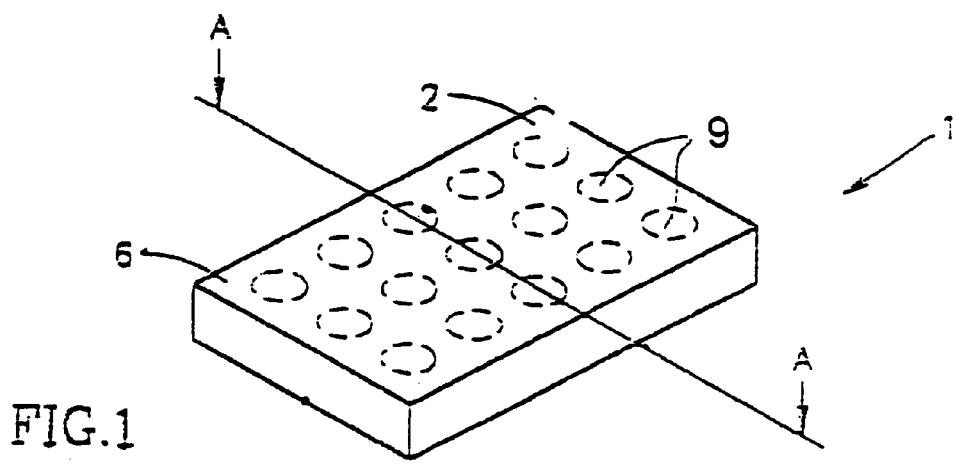
FIG. 1 is a pictorial view of a finished discrete aluminum substrate in accordance with a first embodiment of the present invention;.

In the drawings, different materials during the process of manufacturing a device of the present invention are shown in different shading, the different materials including aluminum metal, porous aluminum oxide, and a mask. In addition, porous anodization is illustrated by arrows with curly tails.

Figure 2:
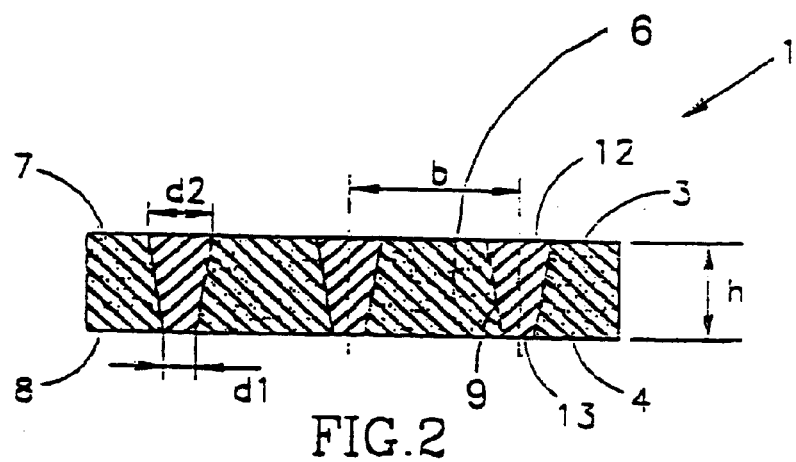
FIG. 2 is a cross section view of the substrate of FIG. 1 along line A—A.
Figure 3:
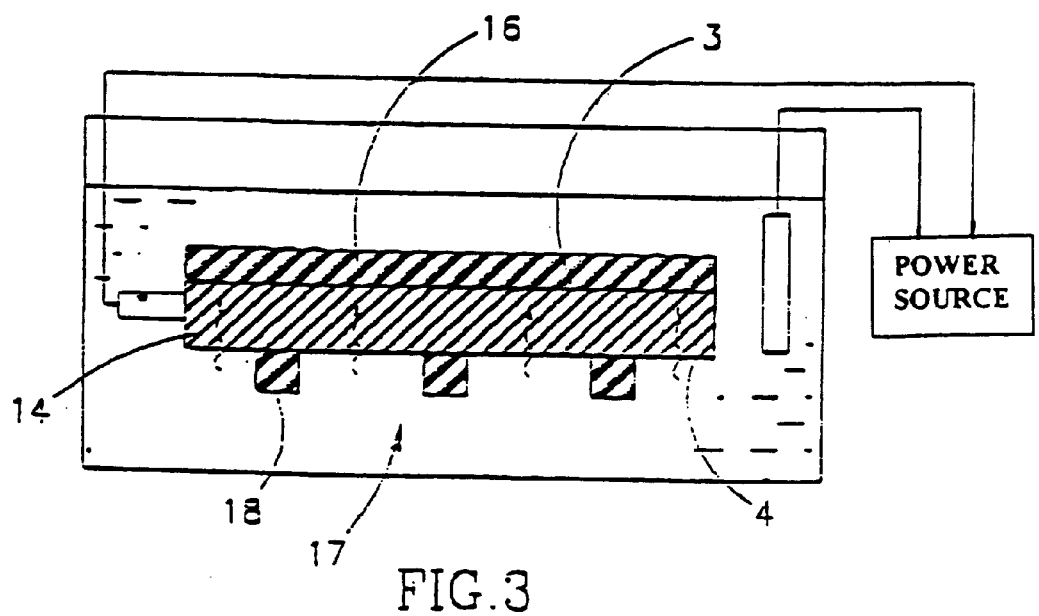
FIG. 3 is a pictorial view showing the porous oxidization of a blank during the manufacture of the substrate of FIG. 1.

With reference now to FIGS. 1–3, a device 1 for use as a BGA support structure, and MCM support structure, a CSP support structure and the like has a discrete solid body 2 with opposing generally parallel major surfaces 3 and 4. The solid body 2 has a sealed or unsealed porous aluminum oxide body portion 6 with a pair of exterior surfaces 7 and 8 constituting portions of the major surfaces 3 and 4, respectively. The body portion 6 has an array of one or more electrically insulated inverted frusto-conical aluminum vias 9 embedded therein. Each aluminum via 9 constitutes an electrically insulated original valve metal conductive trace and has exterior surfaces 12 and 13 constituting portions of the major surfaces 3 and 4, respectively. The device 1 is manufactured from an aluminum blank 14 with a full mask 16 applied to its major surface 3 and an array 17 of circular masking elements 18 corresponding to the array of aluminum vias 9 applied to its major surface 4 prior to its undergoing one stage one-sided porous anodization. A typical device 1 has the following specification: h=100 $\mu$m, b=300 $\mu$m, $d_1$=75 $\mu$m, and $d_2$=150 $\mu$m.

Figure 4:
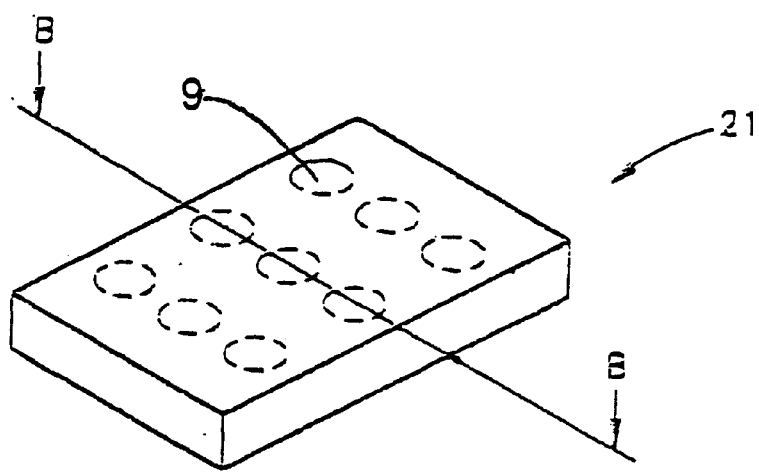
FIGS. 4–6 correspond to FIGS. 1–3 for a finished discrete aluminum substrate in accordance with a second embodiment of the present invention.
Figure 5:
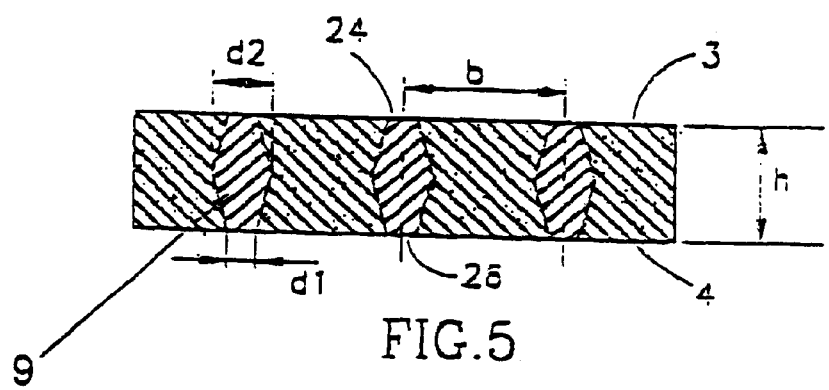
Figure 6:
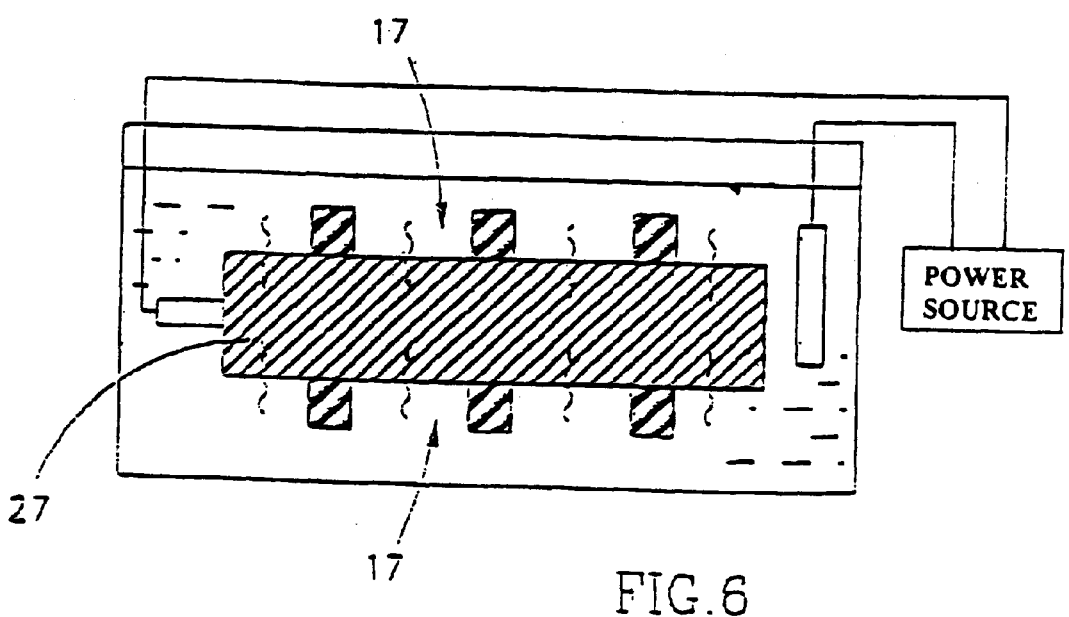

Turning now to FIGS. 4–6, a device 21 is similar to the device 1 of FIG. 1 and differs therefrom in that it is thicker and that the vias 9 are barrel shaped, namely, each aluminum via 9 initially diverges and thereafter converges from an exterior surface 24 constituting a portion of the major surface 3 to an exterior surface 26 constituting a portion of the major surface 4. The device 21 is manufactured from aluminum blank 27 with two identical arrays 17 applied to its major surfaces 3 and 4 prior to its undergoing one stage dual-sided porous anodization. A typical device 21 has the following specification: h=200 $\mu$m, b=0.3 mm, $d_1$=120 $\mu$m, and $d_2$=150 $\mu$m.

Figure 7:
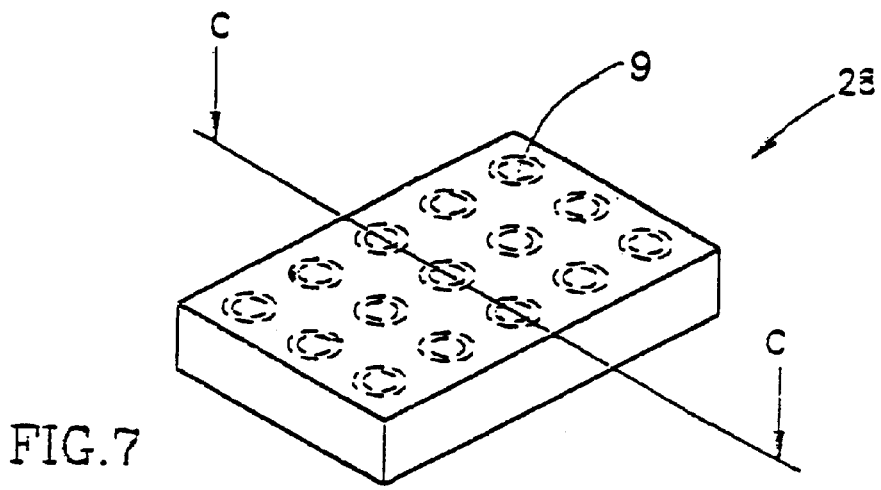
FIGS. 7–9 correspond to FIGS. 1–3 for a finished discrete aluminum substrate in accordance with a third embodiment of the present invention.
Figure 8:
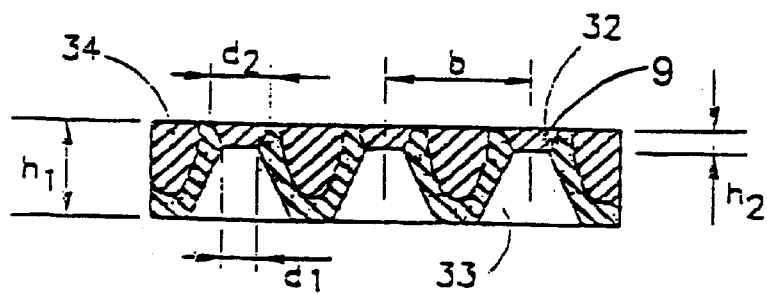
Figure 9:
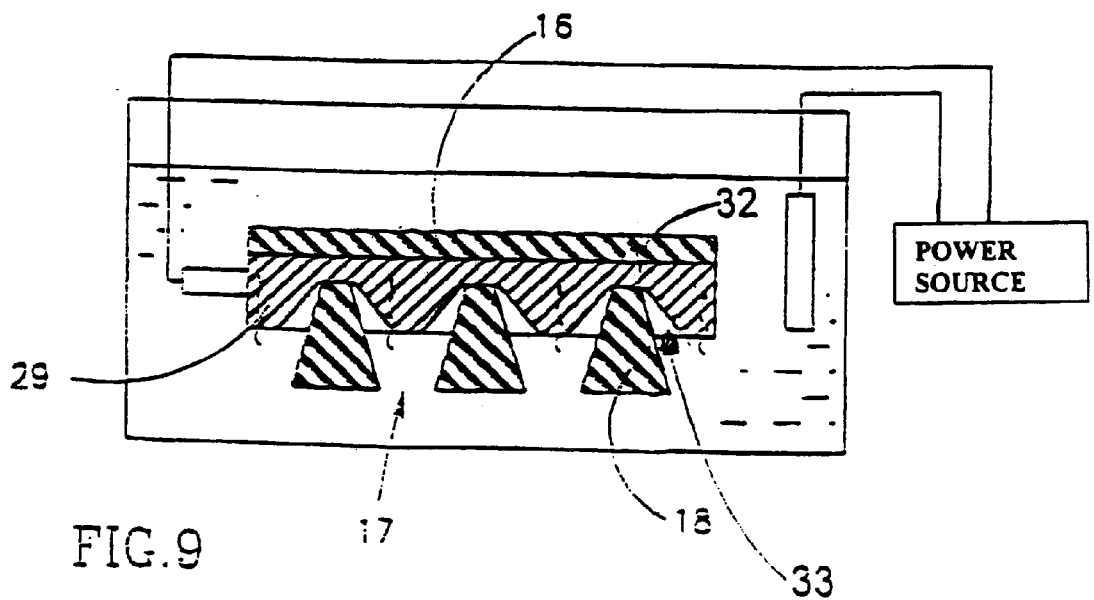

Turning now to FIGS. 7–9, a device 28 is similar to the device 1 of FIG. 1 and differs therefrom in that it is manufactured from an aluminum blank 29 having an array of thin regions 32, each thin region 32 being atop a frusto-conical shaped recess 33. The aluminum blank 29 undergoes one stage one-sided porous anodization in a similar fashion to the aluminum blank 14 of FIG. 3 so as to form an array of aluminum vias 9 in the thin regions 32 and whereby electrically insulated aluminum pockets 34 are also formed. A typical device 28 has the following specification: h1=500 $\mu$m, h2=100 $\mu$m, b=1000 $\mu$m, d1=100 $\mu$m, and d2=150 $\mu$m.

Figure 10:
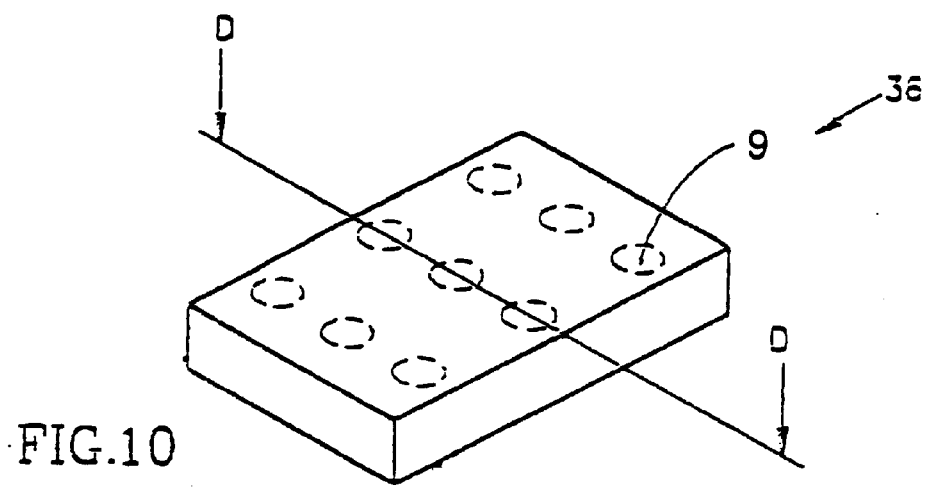
FIGS. 10–12 correspond to FIGS. 1–3 for a finished discrete aluminum substrate in accordance with a fourth embodiment of the present invention.
Figure 11:
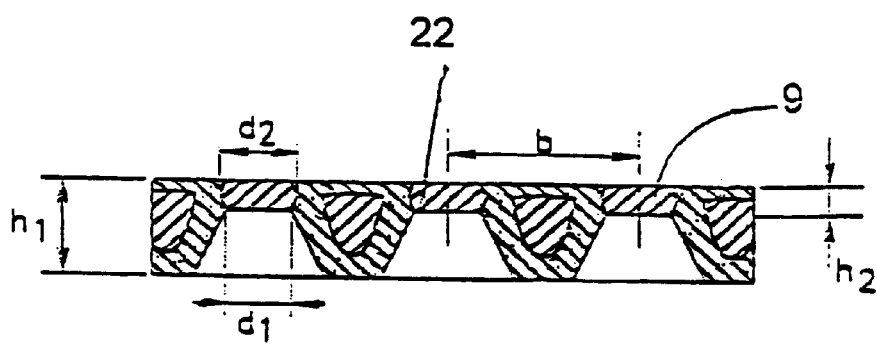
Figure 12:
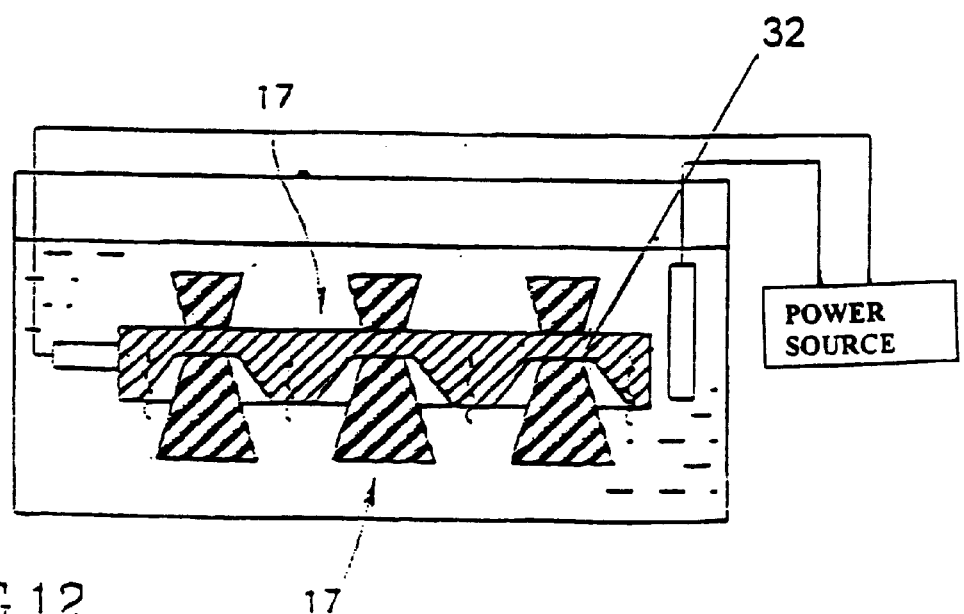

Turning now to FIGS. 10–12, a device 36 is similar to the device 28 of FIG. 7 and differs therefrom in that it has a thicker thin portions 32 thereby requiring one stage dual-sided porous anodization in a similar fashion to the blank 27 of FIG. 6 which leads to an array of barrel-shaped aluminum vias 9. A typical device 36 has the following specification: $h_1$=500 $\mu$m, $h_2$=200 $\mu$m, b=1000 $\mu$m, $d_1$=150 $\mu$m, and $d_2$=200 $\mu$m.

Figure 13:
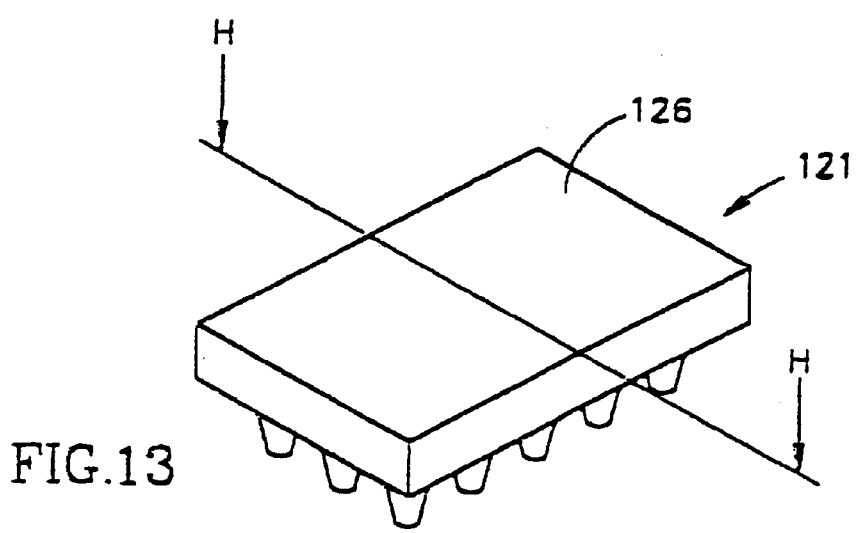
FIG. 13 is a perspective view of a pin jig fixture in accordance with the present invention.
Figure 14:
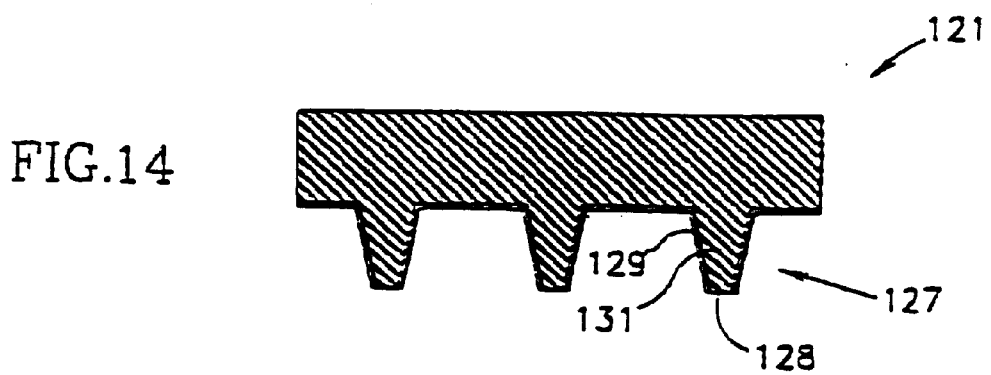
FIG. 14 is a cross section view of the pin jig fixture of FIG. 13 along line E–E.
Figure 15:
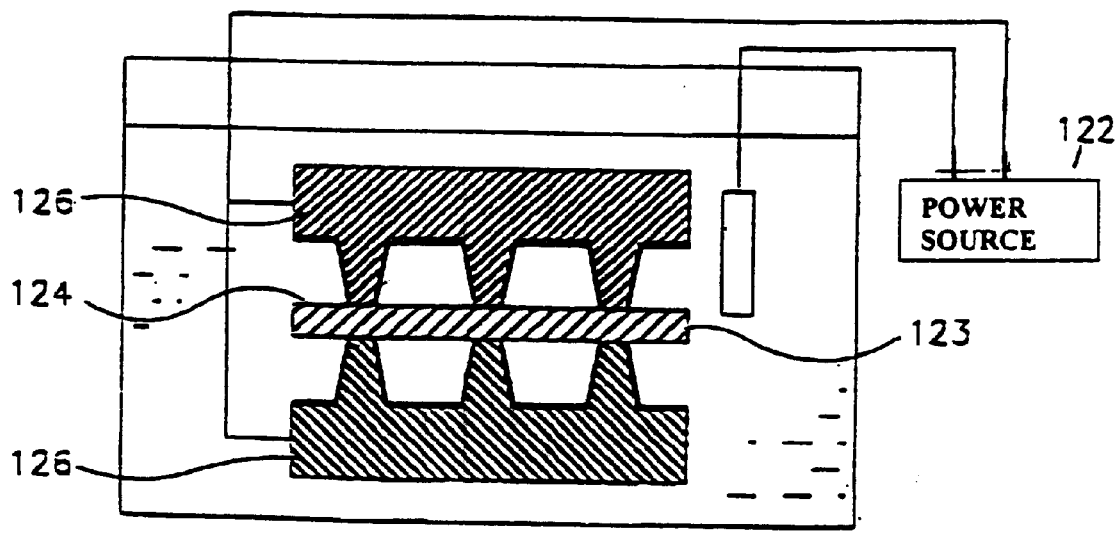
FIG. 15 is a side view showing the mechanical clamping of a substrate by two pin jig fixtures of Fixture 13.

Turning now to FIGS. 13–15, a pin jig fixture 121 for use with an electrical power source (PS) 122 for porous anodization of a valve metal blank 123 with a surface 124 includes a bed of cone shaped pins 126. The bed of pins 126 is made from titanium and is directly connected to the power source 122. Each pin 127 has a leading end surface 128 for intimate juxtaposition against the surface 124 for connection of the blank 123 to the power source 122. During porous anodization, all the underside surface of the pin jig fixture 121 including the peripheral surfaces 129 of the pins 127 is converted into dense titanium oxide whilst all its interior including the cores 131 of the pins 127 remain titanium such that the pin jig Ore 121 is suitable for multiple porous anodizations.

A single pin jig fixture 121 can be employed in one-sided porous anodization, for example, to selectively pattern aluminum blanks 14 and 27 in the manufacture of discrete aluminum substrates 1 and 28, respectively. Or a pair of fact-to-face pin jig fixtures 121 can be employed in two-sided porous anodization, for example, to selectively pattern aluminum blank 29 in the manufacture of discrete aluminum substrates 21 and 36, respectively.

While the invention has been described with respect to a limited number of embodiments, it will be appreciated that many variations, modifications, and other applications of the invention can be made.

What is claimed is:

1. A substrate for use in electronic packaging, the substrate consisting of a discrete, non-layered, solid body having a pair of generally parallel major surfaces and having one or more electrically insulated original valve metal vias substantially perpendicularly disposed to said major surfaces and at least partially surrounded by porous valve metal oxide based material, each via having exposed end surfaces substantially co-directional with said major surfaces, the substrate being formed only from a non-layered original valve metal solid blank having major surfaces with a distance therebetween equal to a distance between the substrate's major surfaces, by a single process of porous anodization of said blank with the blank's major surfaces being masked, at least one of the blank's major surfaces being masked selectively, for converting portions of said blank that were non-masked at least at one of the blank's major surfaces into porous valve metal oxide and thereby retaining portions of said blank that were masked at both of the blank's major surfaces as said one or more electrically insulated original valve metal vias.

2. A substrate according to claim 1, wherein a via has a generally diverging cross section therealong and a maximum thickness between said end surfaces of between about 25 $\mu$m and about 150 $\mu$m.

3. A substrate according to claim 1, wherein a via has a barrel shaped cross section area therealong and a maximum thickness between said end surfaces of between about 25 $\mu$m and about 150 $\mu$m.

4. A substrate according to claims 1, 2 or 3, wherein said solid body has one or more recesses in one of said major surfaces inwardly extending toward the other of said major surfaces thereby forming a corresponding number of thin portions, at least one of said thin portions constituting an electrically insulated original valve metal via.

5. A substrate according to claim 4 wherein non-recessed portions have a thickness between said major surfaces from about 200 $\mu$m to about 10 mm.

6. A substrate according to claim 4 wherein a recess has a frusto-conical shape.

7. A substrate according to claim 1, wherein both major surfaces of said blank are masked selectively for said single process of porous anodization.

8. A process for manufacturing a substrate having a desired product specification for use in electronic packaging, the process consisting only of the steps of:

(a) providing a discrete valve metal non-layered solid blank having a pair of opposing generally parallel major surfaces;

(b) covering both said major surfaces of the non-layered solid blank with masks, in accordance with the desired product specification, at least one of said major surfaces being masked selectively;

(c) porously anodizing the masked non-layered solid blank for converting portions of said blank that were non-masked at least at one of the blank's major surfaces into porous valve metal oxide material and thereby retaining portions of said blank that were masked at both said blank's major surfaces as one or more electrically insulated original valve metal vias embedded in said porous valve metal oxide material; and (d) removing said masks from both said major surfaces.

9. A process according to claim 8, wherein one major surface of the blank is fully masked, whereby the blank undergoes one-sided porous anodization, wherein a distance between the major surfaces of the blank has a maximal value between about 25 $\mu$m and about 150 $\mu$m.

10. A process according to claim 9, wherein said vias have a cross-sectional area diverging away from at least one of said major surfaces.

11. A process according to claim 8, wherein both said major surfaces of said blank are masked selectively, whereby the blank undergoes two-sided porous anodization, wherein a distance between the major surfaces of the blank has a maximal value between about 25 $\mu$m and about 300 $\mu$m.

12. A pin jig fixture for mechanically masking a metal surface, the pin jig fixture being connected to an electrical power source and comprising a bed of pins each having a leading end surface for intimate juxtaposition against the metal surface for masking a corresponding area thereof, one or more of said leading end surfaces being directly connected to the electrical power source for electrically connecting the electrical power source to the metal surface on intimate juxtaposition thereagainst.

13. A pin jig fixture according to claim 12 wherein said bed of pins is formed from an electrically conductive metal based material.

14. A pin jig fixture according to claim 13, wherein said bed of pins is formed from an anodization resistant valve metal based material.

15. A pin jig fixture according to claim 12, wherein the leading end surfaces of said bed of pins are substantially co-planar.

16. A pin jig fixture according to claim 12, wherein said pins are of two or more different lengths.

17. A process for preparing a selectively masked valve metal surface, the process comprising the steps of:

(a) providing a pin jig fixture comprising a bed of pins each having a leading end surface, one or more of said leading end surfaces being coupled with one or more electrical power source connection points;

(b) intimately juxtaposing the leading end surfaces of the bed of pins against a valve metal surface to mask a corresponding area of the valve metal surface;

(c) electrically connecting the pin jig fixture to an electrical power source, thereby electrically connecting the electrical power source to the corresponding masked area of the valve metal surface; and (d) porously anodizing the valve metal surface.

18. A substrate for use in electronic packaging, the substrate comprising a discrete, non-layered solid body having a pair of generally parallel major surfaces and having one or more electrically insulated original valve metal vias diverging inwardly away from at least one of said major surfaces and at least partially surrounded by porous valve metal oxide based material, each via having exposed end surfaces substantially co-directional with said major surfaces, the substrate being form, only from an original valve metal non-layered solid blank by a single process of porous anodization of said blank.

19. A substrate according to claim 18, wherein said vias diverge inwardly away from both said major surfaces.

* * * * *